(12) United States Patent
Aleksov et al.

(10) Patent No.: US 11,688,660 B2
(45) Date of Patent: Jun. 27, 2023

(54) BRIDGE FOR RADIO FREQUENCY (RF) MULTI-CHIP MODULES

(71) Applicant: Intel Corporation, Santa Clara, CA (US)

(72) Inventors: Aleksandar Aleksov, Chandler, AZ (US); Feras Eid, Chandler, AZ (US); Georgios Dogiamis, Chandler, AZ (US); Telesphor Kamgaing, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 809 days.

(21) Appl. No.: 16/534,820

(22) Filed: Aug. 7, 2019

(65) Prior Publication Data

US 2021/0044030 A1   Feb. 11, 2021

(51) Int. Cl.
*H01Q 23/00* (2006.01)
*H01Q 1/52* (2006.01)
*H01Q 1/02* (2006.01)
*H01L 23/36* (2006.01)
*H01L 23/538* (2006.01)
*H01L 23/552* (2006.01)

(52) U.S. Cl.
CPC .......... *H01L 23/36* (2013.01); *H01L 23/5381* (2013.01); *H01L 23/552* (2013.01)

(58) Field of Classification Search
CPC ..... H01L 23/498–49894; H01L 23/538–5389; H01L 23/3128; H01L 23/12–15; H01L 23/40–4093; H01L 23/38; H01L 23/34–4735; H01L 23/66; H01L 23/552; H01L 33/645; H01L 33/64–68; H01L 21/4846–4867; H01L 21/4807–481; H01L 21/4871–4882; H01L 25/0652; H01L 25/071; H01L 25/112; H01L 31/024; H01L 31/052–0525; H01L 2924/3025; H01Q 23/00; H01Q 1/02; H01Q 1/52
See application file for complete search history.

(56) References Cited

U.S. PATENT DOCUMENTS 9,379,090 B1 * 6/2016 Syed .................. H01L 23/49816
2013/0168854 A1 * 7/2013 Karikalan ............... H01L 24/73
257/784

* cited by examiner

*Primary Examiner* — Victor A Mandala
*Assistant Examiner* — Lawrence C Tynes, Jr.
(74) *Attorney, Agent, or Firm* — Akona IP PC

(57) ABSTRACT

Embodiments may relate to a radio frequency (RF) multi-chip module that includes a first RF die and a second RF die. The first and second RF dies may be coupled with a package substrate at an inactive side of the respective dies. A bridge may be coupled with an active side of the first and second RF dies die such that the first and second RF dies are communicatively coupled through the bridge, and such that the first and second RF dies are at least partially between the package substrate and the bridge. Other embodiments may be described or claimed.

16 Claims, 10 Drawing Sheets

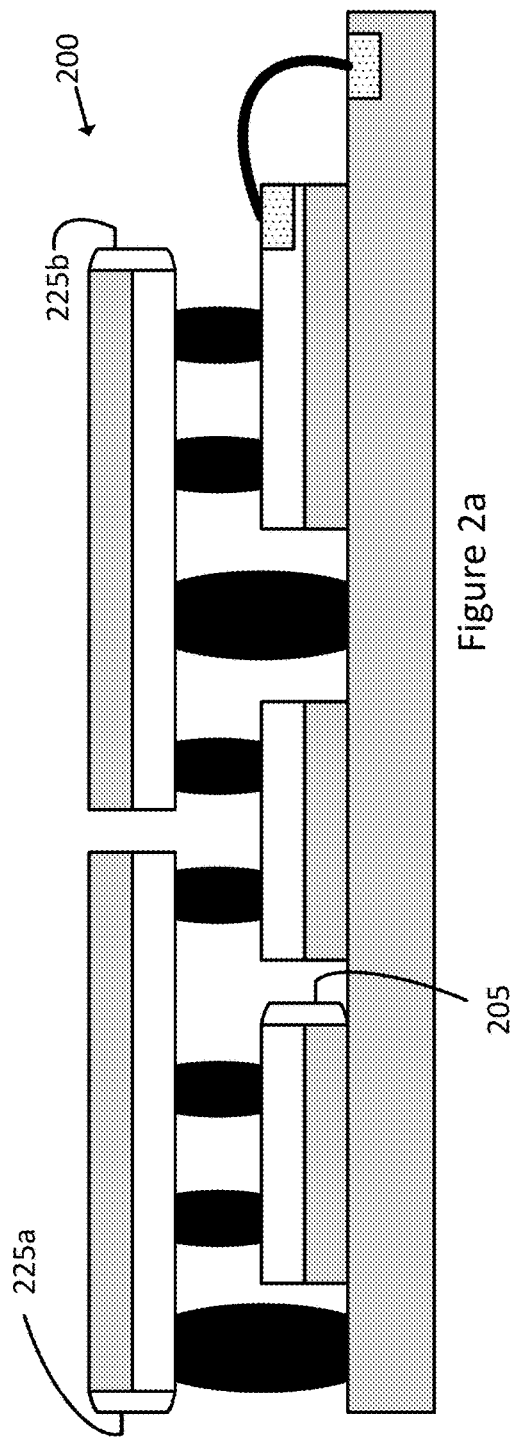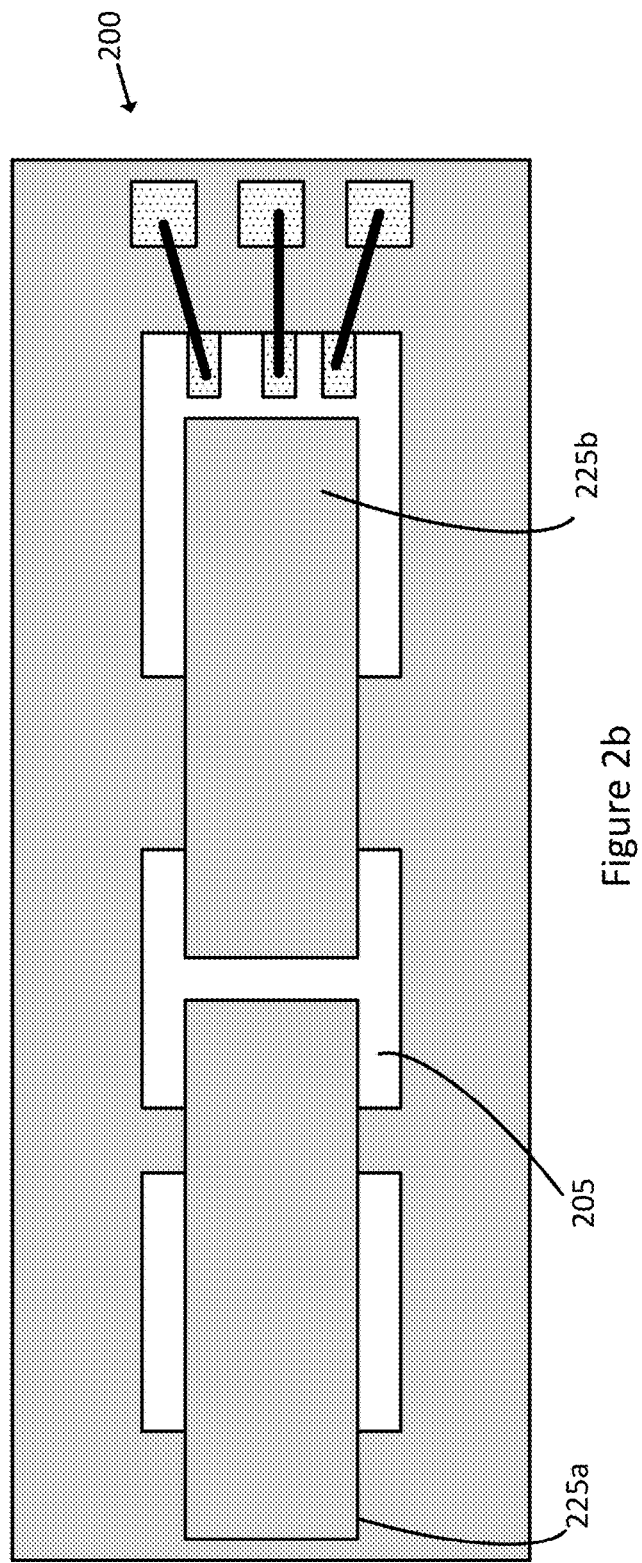

US 11,688,660 B2

BRIDGE FOR RADIO FREQUENCY (RF) MULTI-CHIP MODULES

BACKGROUND

As future specifications for radio frequency (RF) interconnectivity and RF shielding are expected to be more stringent, legacy solutions such as wire-bonds and package-based interconnects may not meet desirable quality metrics. Such metrics may involve characteristics such as interconnect density, losses, and cross-talk. Additionally, typical wire-bond based RF shielding may become less desirable as frequency bands are filled or move to higher frequencies.

BRIEF DESCRIPTION OF THE DRAWINGS

FIGS. 2a and 2b depict an alternative simplified example RF multi-chip module with a bridge, in accordance with various embodiments.

DETAILED DESCRIPTION

Figure 1A:
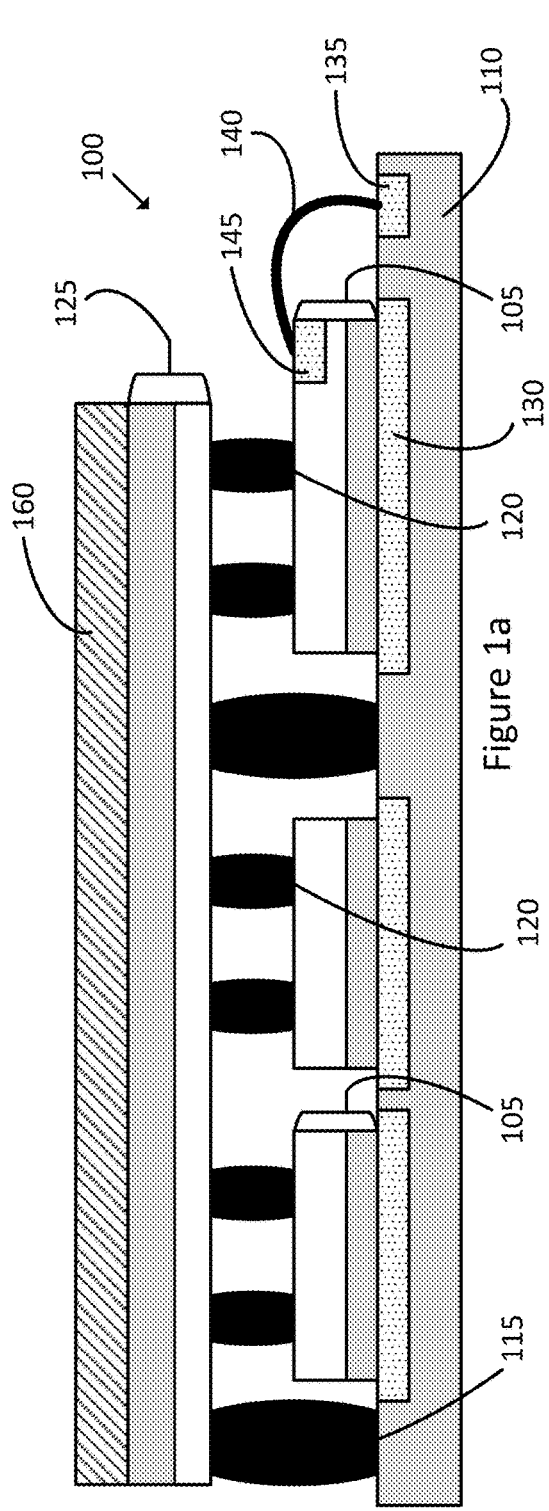
FIGS. 1a and 1b depict a simplified example RF multi-chip module with a bridge, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As previously noted, future specifications for RF interconnectivity and RF shielding may be more stringent than those in legacy RF multi-chip modules (which may also be referred to as a microelectronic package, a semiconductor package, a RF system-in-package (SiP), etc.). Embodiments herein may relate to various characteristics that may be desirable for an RF multi-chip module. Specifically, embodiments may relate to RF die-to-die interconnectivity, RF shielding, and thermal solutions for RF multi-chip modules.

It may be desirable for discrete RF dies such as power amplifiers (PAs), etc. within a multi-chip module to be connected to each other or to other dies. Often, such legacy multi-chip modules may use wire-bonds to connect the RF dies first to the package substrate, and then through various package interconnects or other conductive elements to other passive components, active components, dies, etc.

With respect to RF shielding, wire-bonds may be used, however the resultant shielding may not be at a desirable level because individual wire-bonds may not sufficiently shield an entire RF die. In cases where the dies are mounted to a package substrate of the multi-chip module face-up, it may be difficult to shield the RF dies in legacy packages using a shield element other than wire-bonds. For flip-chip dies or components, metal may be sputtered or evaporated over the dies to provide for RF shielding.

However, with respect to RF shielding, wire-bonds may lead to an increase in package area due to design rules on how the wire may be guided from the pad on the die to the pad on the substrate. Specifically, if wire-bonds are used for RF shielding, the wires may noticeably increase the z-height of the multi-chip module.

With respect to legacy thermal solutions, for dies that are mounted face-up to a package substrate (i.e., wherein the active side of the RF dies is facing away from the package substrate), the primary thermal solution may be to have a large copper structure between the die and the package substrate, and the RF die may be coupled with the thermal solution using a thermal adhesive.

However, with respect to legacy thermal solutions, especially for face-up mounted dies, the thermal energy from the die may be extracted through the die into the substrate onto which the die is mounted. This solution may be undesirable because it may render one or more layers below the die shadow to be inoperable with respect to signal routing because of the excess thermal energy. Therefore, as future multi-chip modules have increasing PA performance characteristics or RF die performance characteristics, this heat extraction path may be undesirable. However, because face-up die interconnects to the package are wire-bonds, there may not be another appropriate legacy solution that may be used to extract heat from the top of the RF dies. Generally, heat extraction through the top of the RF dies may have various advantages for the RF dies, because the heat extractors may be able to be placed relatively close to active elements (e.g., transistors) of the RF die.

To address one or more of the above concerns, embodiments herein may use a passive or active die as a bridge to provide or improve functionality to RF multi-chip modules such as interconnectivity, electromagnetic (EM) shielding, or heat extraction. The bridges may provide connectivity above other elements in the RF multi-chip module, especially those that are mounted face-up onto a package substrate. These bridges may not only interconnect RF elements on the package substrate, but may also provide an alternate (as compared to wire-bonds) connectivity between RF components on the package substrate and the package substrate itself. Generally, embodiments may also be applied to dies that are face down with through-substrate vias (TSVs) connecting the front circuit to the back. In this embodiment, at least one die may have the bridge connected on the backside of the die.

Embodiments may provide a number of advantages over legacy solutions. Specifically, embodiments may allow for optimization or reduction of package area, because wire-bond pads may not be required (although, the wire-bond pads may be present if desired). Additionally, embodiments herein may provide a higher interconnect density between RF dies and components than wire-bond or flip-chip based legacy packages. Additionally, embodiments may allow for improved thermal performance of the various packages.

Figure 1B:
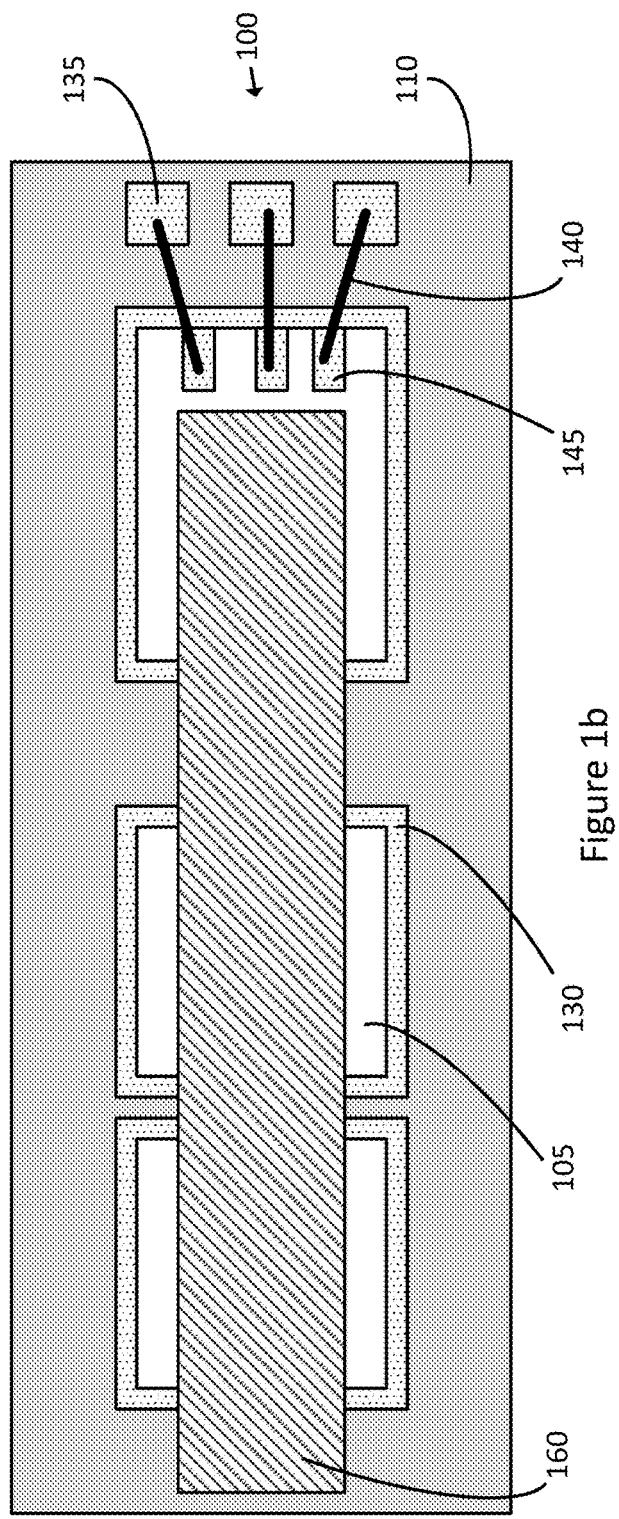

FIGS. 1a and 1b (which may be collectively referred to as FIG. 1) together depict an example RF multi-chip module 100 with a bridge 125, in accordance with various embodiments. Specifically, FIG. 1a is generally a simplified cross-sectional side view of the RF multi-chip module 100, while FIG. 1b is a simplified top-down view of the RF multi-chip module 100. It will be understood that in descriptions of FIG. 1 and other Figures herein, each and every element of the Figure may not be specifically labelled for the sake of elimination of clutter and redundancy. However, it will be further understood that generally similar elements within a Figure (e.g., the various dies, interconnects, etc.) may be considered to share characteristics described herein unless indicated otherwise. Additionally, elements in a subsequent Figure that are generally similar to elements of a previous Figure such as FIG. 1 or 3 may be considered to share characteristics with the elements of the previous Figure unless indicated otherwise.

The RF multi-chip module 100 may include an RF die 105 coupled with a package substrate 110. Specifically, the backside (e.g., the inactive side) of the die 105 may be coupled with the package substrate 110 while the front-side (e.g., the active side) of the die is facing away from the package substrate 110 as will be explained in greater detail with respect to FIG. 3.

The die 105 may be a die that includes active circuits related to a transmit module. The active circuits may include circuits such as control logic, one or more switches, one or more power management integrated circuits (PMICs), one or more radio frequency integrated circuits (RFICs) one or more PAs, or some other component of a transmit module. Additionally or alternatively, the die 105 may include active circuits related to a receive module. The active circuits may include control logic, one or more switches, one or more PMICs, one or more RFICs, one or more low-noise amplifiers (LNAs), or some other component of a receive module. In some embodiments, the die may further include mixers, phase shifters, or some other circuit which may facilitate the reception of, or processing of, an electronic signal such as a wireless signal. In some embodiments, the die 105 may include one or more passive elements such as capacitors, resistors, inductors, etc.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate.

In some embodiments, the die 105 may be coupled with one or more pads 130 of the package substrate 110. In some embodiments, the pads 130 may be or include a conductive element. An active element of the die 105 (e.g., a transistor or some other active element or circuitry) may be coupled with the pads 130 by a TSV through the backside of the die 105 that allows communication between the active element of the die 105 and the pads. The TSVs are not depicted in FIG. 1 for the sake of avoidance of extra clutter of the Figure. An example conductive element may be formed of, for example, gold, copper, or some other conductive material. The pads 130 may additionally or alternatively be formed of an adhesive material that assists with the physical coupling of the die 105 to the package substrate 110. In some embodiments, the pads 130 may be flush with the surface of the package substrate 110 as shown, while in other embodiments the pads 130 may at least partially protrude from the surface of the package substrate 110, or be located on the surface of the package substrate 110.

The die 105 may include a pad 145, which may be similar to, and share one or more characteristics with pads 130. Specifically, the pad 145 may be or include a conductive material such as gold, copper, or some other conductive material. The pad 145 may be flush with, at least partially protruding from, or located on the surface of the die 105. The pad 145 may be located on the front-side, e.g. the "active side" of the die 105. Similarly, the package substrate 110 may include an additional pad 135 which may be formed of a conductive material such as gold, copper, or some other conductive material. The pad 135 may be flush with, at least partially protruding from, or located on the surface of the package substrate 110. The die 105 may be communicatively coupled with the package substrate 110 by a wire-bond 140 that is coupled with the pads 135 and 145. Specifically, the wire-bond 140 may be formed of an electrically or thermally conductive material such as copper or gold that allows thermal energy or electrical signals to pass between the pads 145 and 135.

The RF multi-chip module 100 may further include a bridge 125 coupled to various of the dies 105. The bridge 125 may be a die that includes one or more active or passive elements. In some embodiments, the bridge 125 may be formed of a material such as silicon, as will be described in greater detail with respect to FIG. 3. As such, the bridge 125 may be referred to as a "silicon die" or a "silicon bridge." The bridge 125 may be configured to provide one or more of the features previously described. Specifically, the bridge 125 may communicatively couple various of the dies 105 to one another, the bridge 125 may provide EM shielding to various of the dies 105, or the bridge 125 may provide or facilitate a thermal solution to one or more of the dies 105.

In embodiments wherein the bridge 125 is intended to provide or facilitate a thermal solution to one or more of the dies 105, the bridge 125 may be coupled with an integrated heat spreader (IHS) 160. The IHS 160 may be coupled with the bridge by a thermal interface material (TIM) such as a polymer-based TIM (PTIM), a solder-based TIM (STIM) or some other type of TIM. The IHS 160 may be formed of a thermally conductive material such as copper or some other material. The IHS 106 may couple with a thermal solution such as a vapor chamber, a water-cooled cooling apparatus, fins, or some other type of thermal solution. The thermal solution is not depicted in FIG. 1 for the sake of reduction of clutter of the Figure.

As can be seen, the bridge 125 may be physically separated from the wire-bond 140. In some embodiments, it may be desirable to have a space of approximately 50 micrometers ("microns") between the bridge 125 and the wire-bond 140. This separation may help to mitigate or eliminate any coupling or loading effects between the bridge 125 and the wire-bond 140.

The bridge 125 may be physically, thermally, or communicatively coupled with the dies 105 by interconnects 120. Additionally, the bridge 125 may be physically, thermally, or communicatively coupled with the package substrate 110 by interconnects 115. Specifically, the interconnects 120 or 115 may be formed of an electrically or thermally conductive material that may allow electrical signals or thermal energy to pass between the package substrate 110 or the die 105 and the bridge 125. In other embodiments, the interconnects 120 or 115 may be neither electrically nor thermally conductive, and instead may serve to primarily physically couple the bridge 125 to the dies 105 or the package substrate 110.

The interconnects 120 or 115 may be, for example, solder bumps that are formed of a material such as tin, silver, copper, etc. If solder bumps are used for the interconnects 120 or 115, then the solder bumps may be elements of a ball grid array (BGA) as shown in FIG. 1. In other embodiments, the interconnects 120 or 115 may be pillars in an array coupled with solder pads on the bridge 125, die 105, or package substrate 110, or some other type of interconnect.

FIGS. 2a and 2b (which may be collectively referred to as FIG. 2) together depict one such variation of example RF multi-chip module 100 with a bridge 125, in accordance with various embodiments. Generally, the multi-chip module 200 may include elements that are similar to, and share one or more characteristics of, elements of the multi-chip module 100 of FIG. 1. However, as may be seen, rather than a singular bridge that connects a plurality of dies, the multi-chip module 200 may include a plurality of bridges 225a and 225b that are coupled with dies 205. The bridges 225a and 225b may be respectively similar to, and share one or more characteristics with, bridge 125. Additionally, the dies 205 may be similar to, and share one or more characteristics with, dies 105. It may be desirable to include a plurality of bridges 225a and 225b if, for example, various of the dies 205 were different sizes, various of the interconnects were different sizes, there were different shielding or thermal requirements for particular dies 205, etc.

Generally, it will be understood that the various elements of FIG. 1 or 2 (and other Figures herein) are intended as examples, and other embodiments may have one or more variations from those depicted. For example, each of the interconnects may not be the same as one another (e.g., the same type, the same material, the same size, etc.) Additionally, each of the dies, pads, or other various elements may not be the same as one another (same type, same size, etc.). Various embodiments may have more or fewer elements than are depicted in FIG. 1 (more or fewer than three dies, more or fewer interconnects or pads, etc.). Other variations may be present in other embodiments. In some embodiments the IHS (e.g., IHS 160) may not be present, for example as shown in FIG. 2. In other embodiments, an IHS may be present and coupled with one or both of bridges 225a and 225b.

Figure 3:
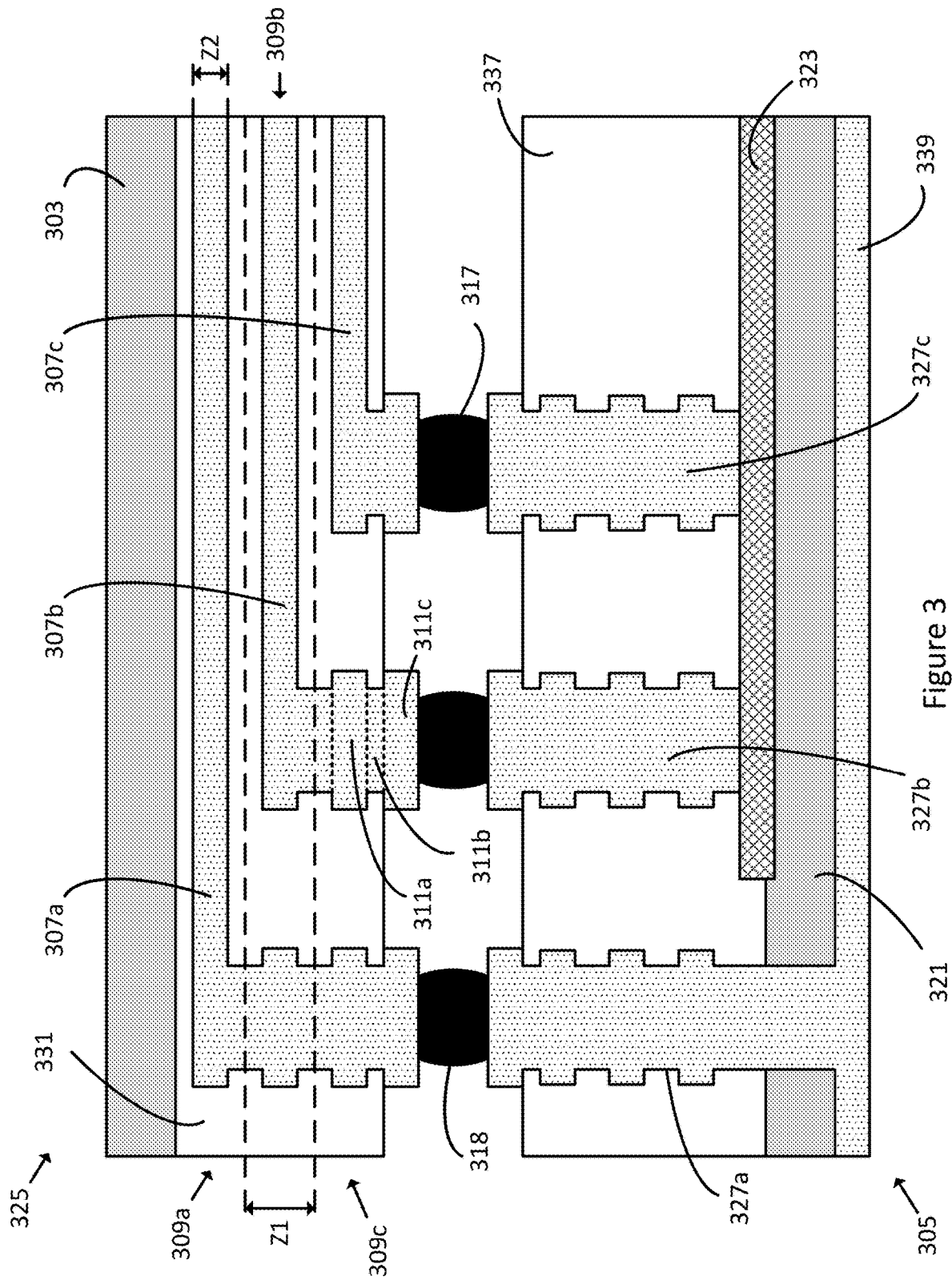
FIG. 3 depicts a simplified example cross-sectional view of a bridge coupled with a die, in accordance with various embodiments.

FIG. 3 depicts a simplified example cross-sectional view of a bridge 325 coupled with a die 305, in accordance with various embodiments. The bridge 325 may be similar to, and share one or more characteristics with, bridge 125. The die 305 may be similar to, and share one or more characteristics with, die 105.

The die 305 may include a backside 321, which may be formed of a material such as silicon, gallium arsenide (GaAs), gallium nitride (GaN), etc. The die 305 may also include a front-side, which may include the back-end 337 and a front-end 323. The back-end 337 of the die may include a number of conductive pathways 327a, 327b, and 327c (collectively conductive pathways 327) within a dielectric material, which may be an oxide dielectric such as silicon dioxide ($SiO_2$). As shown in FIG. 3, the conductive pathways 327 may include a number of vias between layers of the dielectric material, however, it will be understood that the back-end 337 and the various conductive pathways 327 may include a number of additional or alternative conductive elements such as vias, pads, striplines, microstrips, traces, etc. Generally, the conductive pathways 327 within the back-end 337 may allow for communication between different active or passive elements of the die 305, or between active or passive elements of the die 305 and another element of an electronic device to which the die 305 is coupled (e.g., the bridge 325).

The front-end 323 may include one or more active circuits. The active circuits may, for example, include RF circuitry such as PAs, LNAs, switches, etc. which may facilitate the transmission, reception, or processing of one or more RF signals by the die 305. The front-end may also include circuitry which may make up the "logic" of the die 305. For example, the front-end 323 may include circuitry related to processing, memory, etc. The circuitry may take the form of transistors or other circuitry. The front-end 323 may further include one or more passive elements such as inductors, resistors, capacitors, etc.

The die 305 may further include a backside metallization (BSM) layer 339. The BSM layer 339 may be a metallic layer that may serve to increase adhesion of the die 305 to a package substrate such as package substrate 110 through the formation of an inter-metallic compound (IMC) during solder reflow of the resultant package. Additionally or alternatively, the BSM layer 339 may couple with a ground of the package substrate, or an electronic device of which the die 305 is a part, and therefore serve as a ground plane for the die 305.

The bridge 325 may be formed of elements similar to those of the die 305. For example, the bridge 325 may include a backside 303, which may be similar to, and share one or more characteristics with, backside 321 of the die 305. Additionally, the bridge 325 may include an interconnect stack 331 with a number of interconnect layers 309a, 309b, and 309c (collectively, interconnect layers 309). The interconnect stack 331 may be similar to, and share one or more characteristics with, the back-end 337 of the die 305. In various embodiments, the interconnect stack 331 may include materials such as an inorganic oxide, an organic material, ceramic, or some other material.

The interconnect layers 309 may be layers of the interconnect stack 331 in which a number of conductive elements are positioned. As described with respect to back-end 337, the conductive elements may include vias, traces, pads, striplines, microstrips, etc. Generally, the conductive elements may allow for communication between elements of the bridge 325 or between elements of the bridge 325 and elements of an electronic device to which the bridge 325 is coupled. For example, the various conductive elements in a bridge such as bridge 125 may allow for communication between two or more of the pictured dies 105. Generally, the interconnect layers 309 may have a z-height Z1 of between approximately 0.75 microns and approximately 10 microns. The overall z-height of the bridge 325 (as measured in a direction parallel to the measurement Z1) may be between approximately 20 microns and approximately 150 microns.

As noted, the interconnect layers 309 may include a number of conductive elements. The various conductive elements may be formed of a conductive material such as copper, gold, or some other conductive material. One such conductive element may include traces 307a, 307b, and 307c (collectively referred to as "traces 307"). The traces 307 may proceed laterally along a length of the bridge 325. The traces 307 may have a z-height Z2 of between approximately 0.1 microns and approximately 5 microns. In some embodiments, the traces 307 may have a width (as measured into and out of the page of FIG. 3) of between approximately 0.5 microns and approximately 25 microns.

Additional conductive elements may couple the traces 307 to an element external to the bridge 325, for the example the die 305. Such conductive elements may include vias such as vias 311b. The vias 311b may couple the conductive elements between the interconnect layers 309. The conductive elements may further include pads such as pads 311a or 311c. The pads 311a may be located at various of the interconnect layers 309 and couple to vias 311b. The pads 311c may be located at the surface of the bridge 325. In other embodiments the pads 311c may be at least partially embedded within the surface of the bridge 325, or flush with the surface of the bridge 325. It will be understood that these examples of conductive elements are intended as simplified examples. Some embodiments may have more or fewer conductive elements than depicted. In some embodiments, certain elements such as pads 311a may not be present. Other variations may be present in other embodiments. Together, the traces 307, vias 311b, pads 311a/311c, and one or more other conductive elements of the bridge 325 may together be referred to as "interconnects" of the bridge 325.

The interconnects of the bridge 325 may be communicatively coupled with the conductive elements 327 of the die 305 by one or more interconnects such as interconnects 317. The interconnects 317 may be similar to, and share one or more characteristics with, interconnects 120 of FIG. 1. The interconnects of the bridge 325 may further be communicatively coupled with the conductive elements 327 of the die 305 by a shielding element such as shielding element 318. Shielding element 318 may be discussed in further detail below.

Various of the traces 307 may provide different types of electrical connections. For example, as may be seen in FIG. 3, trace 307a may be communicatively coupled with the BSM layer 339 of the die 305. As previously noted, the BSM layer 339 may provide a connection to ground, and therefore the trace 307a may serve as a ground layer or a ground trace for the bridge 325. Additionally, traces 307b and 307c may be communicatively coupled with the front-end 323 of the die 305. In some embodiments, one or more of the traces 307b and 307c may serve as a signal trace, that is, a trace that may route electrical data signals between the front-end 323 of the die 305 and another element that is communicatively coupled with the signal trace. In some embodiments, one or more of the traces 307b and 307c may serve as a power or ground trace, that is provide power or ground between the front-end 323 and another element of an electronic device such as a power source, a ground plane, or some other element. As one example, trace 307b may be a signal trace and trace 307c may be a power trace or a ground trace.

As previously noted, in some embodiments it may be desirable to provide EM shielding to elements of the RF multi-chip module. Specifically, it may be desirable to provide EM shielding to the signal interconnect of the multi-chip module. The signal interconnect may include, for example, the signal trace of the bridge 325 and various conductive elements or interconnects of the bridge 325 or the die 305 to which the signal trace of the bridge 325 is coupled. In this embodiment, the shielding element 318 may provide shielding of the signal interconnect by at least partially surrounding the signal interconnect. Specifically, the shielding element 318 may be electrically coupled with both a ground trace (e.g., trace 307a) as well as the BSM layer 339 of the die (or some other ground plane), which may effectively encapsulate the signal interconnect within a surrounding ground element and thereby provide EM shielding to the signal interconnect.

Figure 4:
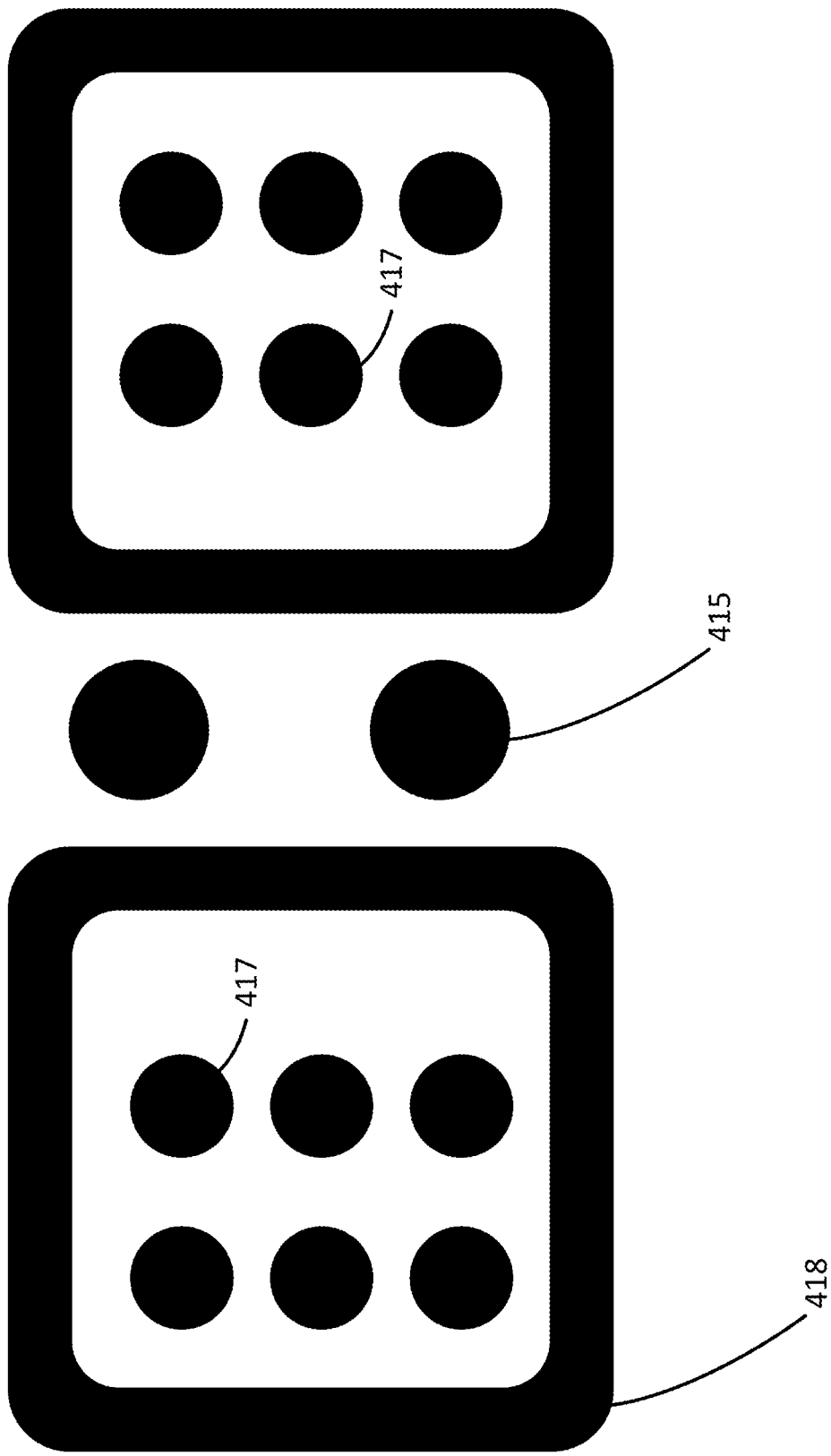
FIG. 4 depicts a simplified top-down view of a RF shielding structure, in accordance with various embodiments.

FIG. 4 depicts a simplified top-down view of a RF shielding structure, in accordance with various embodiments. Specifically, FIG. 4 may depict an example of the RF shielding structure as taken along a line through the interconnects of FIG. 1a (e.g., interconnects 115 and 120) or the interconnects or shielding elements of FIG. 3 (e.g., interconnects 317 or shielding element 318).

Specifically, FIG. 4 may depict a shielding element 418, which may be similar to, and share one or more characteristics with, shielding element 318. The shielding element 418 may be formed of an RF shielding material such as copper or some other material. In some embodiments, the shielding element 418 may be formed of a copper-containing solder material so that the shielding element may additional serve as an interconnect to physically couple a die such as die 305 to a bridge such as bridge 325.

The RF shielding element 418 may generally surround a number of interconnects such as interconnects 417. The interconnects 417 may be similar to, and share one or more characteristics with, interconnects 317 or 120. Additionally interconnects 415 may be present external to the RF shielding element 418. The interconnects 415 may be similar to, and share one or more characteristics with interconnects 115 of FIG. 1.

As can be seen, the shielding element 418 may generally surround one or more interconnects 417. The interconnects 417 may be communicatively couple with, for example, a trace such as traces 320 of a bridge such as bridge 325. Specifically, the interconnects 417 may be communicatively coupled with a signal trace of the bridge, although in other embodiments the interconnects 417 may be additionally or alternatively coupled with a power or ground trace of the bridge. The interconnects 415, i.e., the interconnects that may couple the bridge directly to a package substrate, may be located external to the shielding element 418 as depicted. However, in other embodiments one or more of the interconnects 415 may be located internally to the shielding element 418.

In some embodiments, the shielding element 418 may be a continuous element as depicted, while in other embodiments the shielding element 418 may be formed of a plurality of discrete elements that are spaced together in a given configuration around the interconnects 417. If the shielding element 418 is formed of a plurality of discrete elements that are spaced together, the spacing of the elements may be based on, for example, the wavelength of RF frequencies from which the interconnects 417 should be shielded. As noted previously with respect to FIG. 3 and the shielding element 318, the shielding element 418 may be communicatively coupled with shielding elements within the bridge (e.g., a ground trace or ground plane such as trace 320a) or shielding elements within the die (e.g., a BSM layer of the die such as BSM layer 339).

Figure 5:
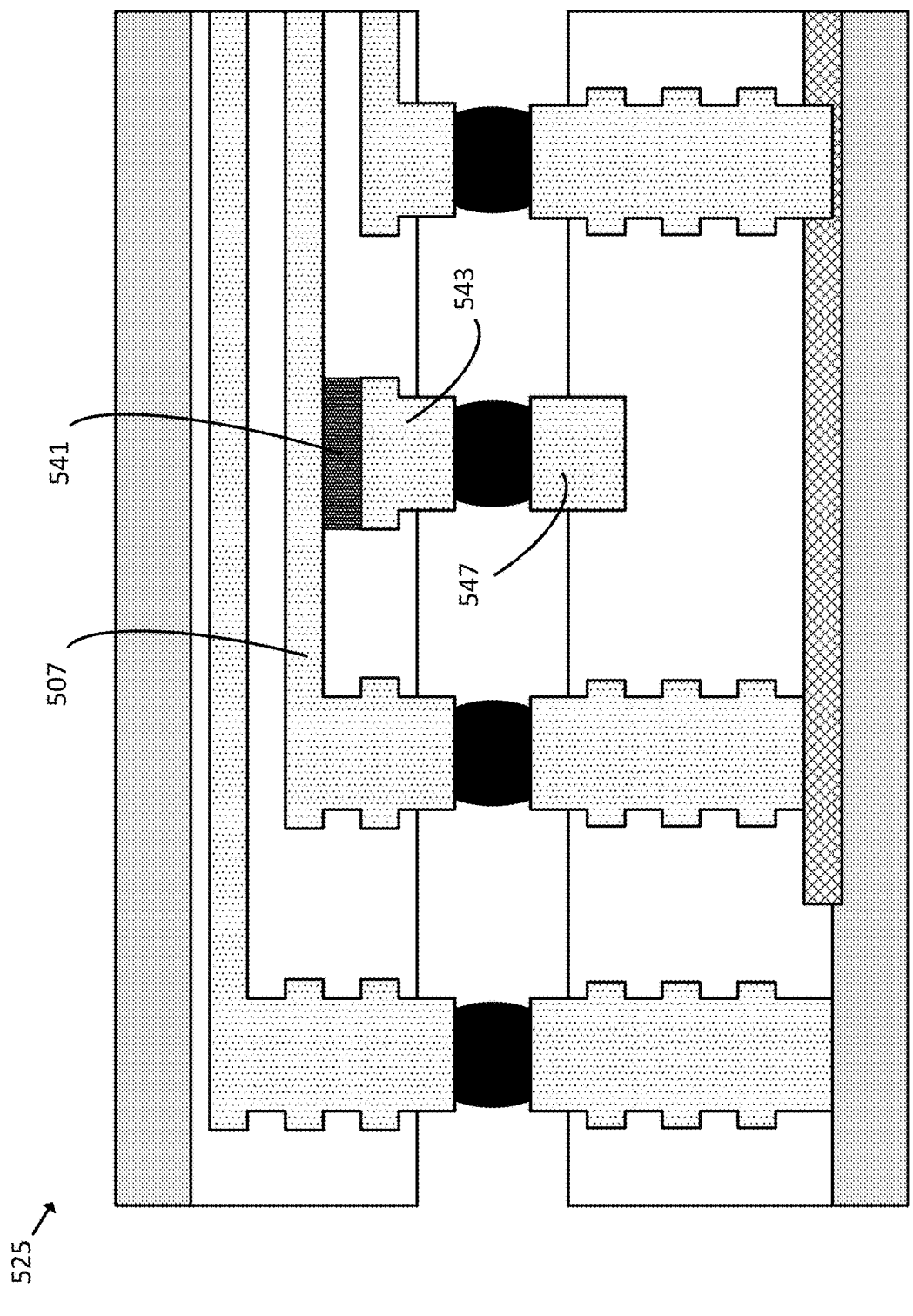
FIG. 5 depicts an alternative simplified example cross-sectional view of a bridge coupled with a die, in accordance with various embodiments.

FIG. 5 depicts an alternative simplified example cross-sectional view of a bridge 525 coupled with a die 505, in accordance with various embodiments. Generally, the bridge 525 and the die 505 may be respectively similar to, and share one or more characteristics with, bridge 325 and die 305. In some embodiments, the bridge 525 may include one or more passive elements such as a resistor, an inductor, a capacitor, etc. FIG. 5 depicts an example of how a capacitor may be formed in the bridge 525. Specifically, a dielectric material 541 may be positioned between two conductive elements of the bridge 525. The dielectric material 541 may be, for example, titanium dioxide ($TiO_2$), barium titanate ($BaTiO_2$), zirconium dioxide ($ZrO_2$), hafnium dioxide ($HfO_2$), silicon nitride ($Si_3N_4$), $SiO_2$, or some other appropriate dielectric material. The selection of dielectric material may be based on, for example, capacitance density, available area, design rules for the capacitors, etc.

The dielectric material 541 may be positioned between a trace 507 (which may be similar to, and share one or more characteristics with, a trace 307) and a conductive pathway 543 of the bridge 525. As can be seen, the conductive pathway 543 may include a pad such as pad 311a and a via such as via 311b. In some embodiments, the conductive pathway 543 may further include an additional pad such as pad 311c, whereas in other embodiments the pad at the surface of the bridge 525 may not be present. In remaining embodiments herein, the pad at the surface of a bridge may not be depicted, however it may be present in other embodiments.

The conductive pathway 543 may be communicatively coupled with a conductive element of the die 505, for example by an interconnect similar to interconnect 317. The conductive element 547 may be coupled with a ground plane of the die 505, a signal element, or some other element.

Generally, the specific connections of the trace 507, the conductive pathway 543, and the conductive element 547 may be based on the use to which the capacitor may be put. For example, if the capacitor is to be used for signaling or matching, then the dielectric material 541 may be positioned between a signal line (e.g., trace 507) and a power or ground connection (e.g., conductive pathway 543). If the capacitor is to be used for power delivery, then the dielectric material 541 may be positioned between ground (e.g., trace 507) and a power connection (e.g., conductive pathway 543). If the capacitor is to be used for decoupling of power delivery, then the dielectric material 541 may be positioned between two power elements (e.g., trace 507 and conductive pathway 543). If the capacitor is to be used for signal coupling or filtering, then the dielectric material 541 may be between two signal lines (e.g., trace 507 and conductive pathway 543. It will be understood that these example connections are intended as examples of possible operation or positioning of the capacitor, and other variations may be present in various other embodiments.

Figure 6:
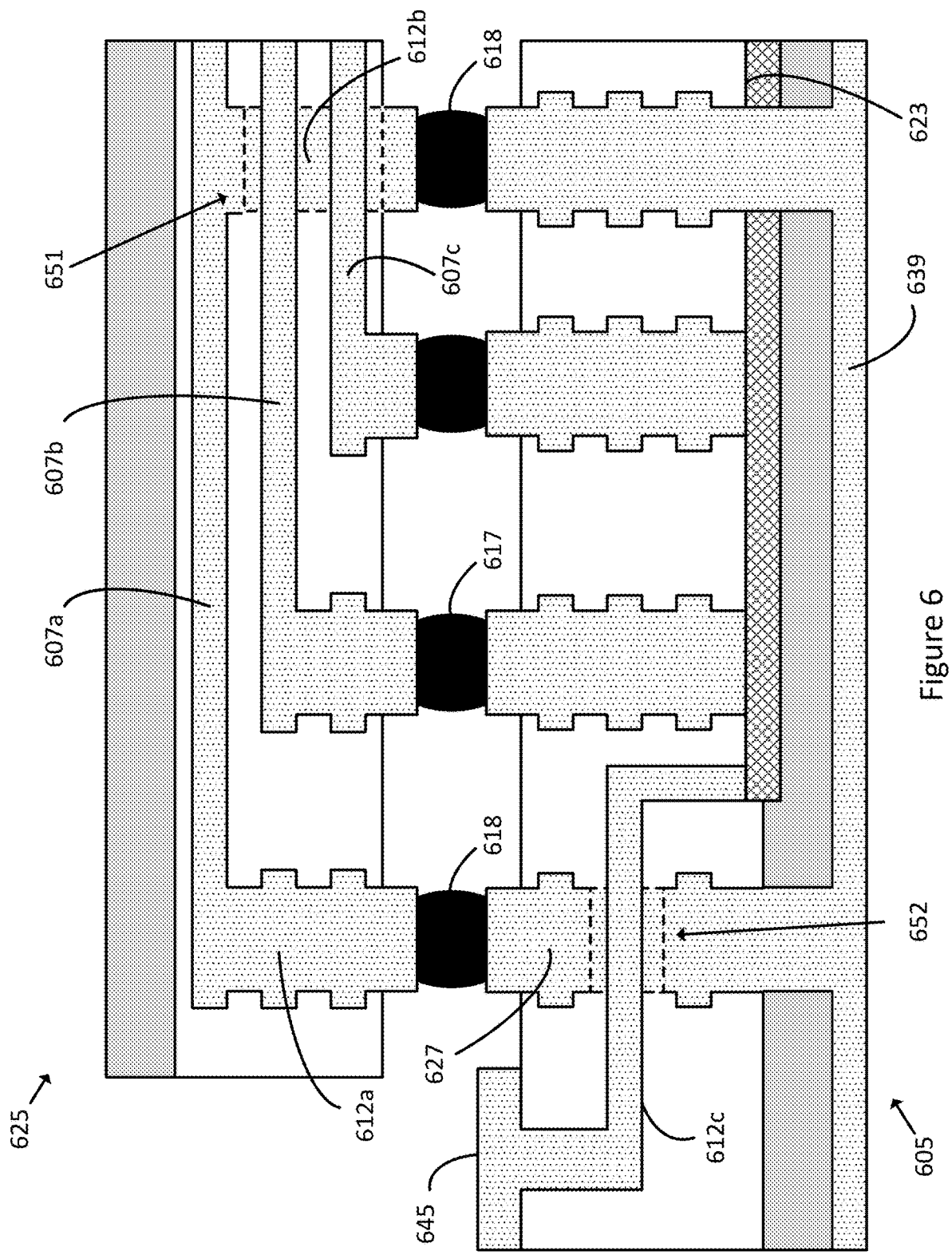
FIG. 6 depicts an alternative simplified example cross-sectional view of a bridge coupled with a die, in accordance with various embodiments.

As noted, various embodiments may be configured to provide RF shielding of components of the RF multi-chip module. FIG. 6 depicts an alternative simplified example cross-sectional view of a bridge 625 coupled with a die 605, in accordance with various embodiments. Specifically, FIG. 6 may depict one example of an internal structure which may provide RF shielding.

Die 605 may be similar to, and share one or more characteristics with, die 305. The die 605 may include elements similar to those of die 305 such as a conductive pathway 627 that is coupled with a BSM layer 639, and a front-end 623. Conductive pathway 627, BSM layer 639, and front-end 623 may be respectively similar to, and share one or more characteristics with, conductive pathways 327, BSM layer 339, and front-end 323.

Similarly, the bridge 625 may include elements which may be similar to those of bridge 325 such as traces 607a, 607b, and 607c (collectively, "traces 607"), which may be respectively similar to, and share one or more characteristics with, traces 307a, 307b, and 307c. The bridge 625 and the die 605 may be coupled with one another by interconnects 617 or shielding element(s) 618, which may be respectively similar to interconnects 317 and shielding element 318. Specifically, the traces 607 may be communicatively coupled with conductive elements or pathways of the die (e.g., similar to conductive pathways 327 of FIG. 3), but the interconnects 617 or the shielding element(s) 618.

Within the bridge, the traces 607 may be communicatively coupled with the interconnects 617 or the shielding elements 618 by conductive pathways which may include one or more vias or pads (e.g., vias or pads similar to vias 311b and pads 311a/311c). Two such conductive pathways may include conductive pathways 612a and 612b, which are both coupled to the trace 607a and the shielding element(s) 618.

As may be seen in FIG. 6, certain of the conductive pathways (e.g., conductive pathway 612b) may at least partially overlap traces 607b and 607c at 651. In this embodiment, the vias, pads, or traces that may make up traces 607a or 607b and the vias, pads, or traces that may make up conductive pathway 612b may be routed such that they do not directly intersect, but rather are routed around one another. By selectively routing elements such as traces 607b and 607c, or the conductive pathway 612b within section 651 such that they do not directly intersect, the RF shielding provided to traces 607b or 607c may continue to be maintained at the bridge while still allowing for the traces to extend beyond the shielding element 618 and couple with another element to which the bridge 625 is coupled.

Similarly, in some embodiments the die 605 may have a pad 645, which may be similar to (and share one or more characteristics of), pad 145. The pad 645 may be communicatively coupled with the front-end 623 of the die 605 by a conductive pathway 612c which may include number of vias, traces, pads, or some combination thereof. The conductive pathway 612c may at least partially overlap conductive pathway 627 at 652. Similarly to the routing described above with respect to section 651, the various traces, vias, pads, etc. that may make up the conductive pathway 627 and the conductive pathway 612c may be routed such that they are routed around one another and do not directly overlap. In this way, RF shielding provided by conductive elements 652 and BSM layer 639 of the die 605 may be effectively maintained while still allowing for routing of signals external to the die 605, and particularly the RF shielded portion of the die.

Figure 7:
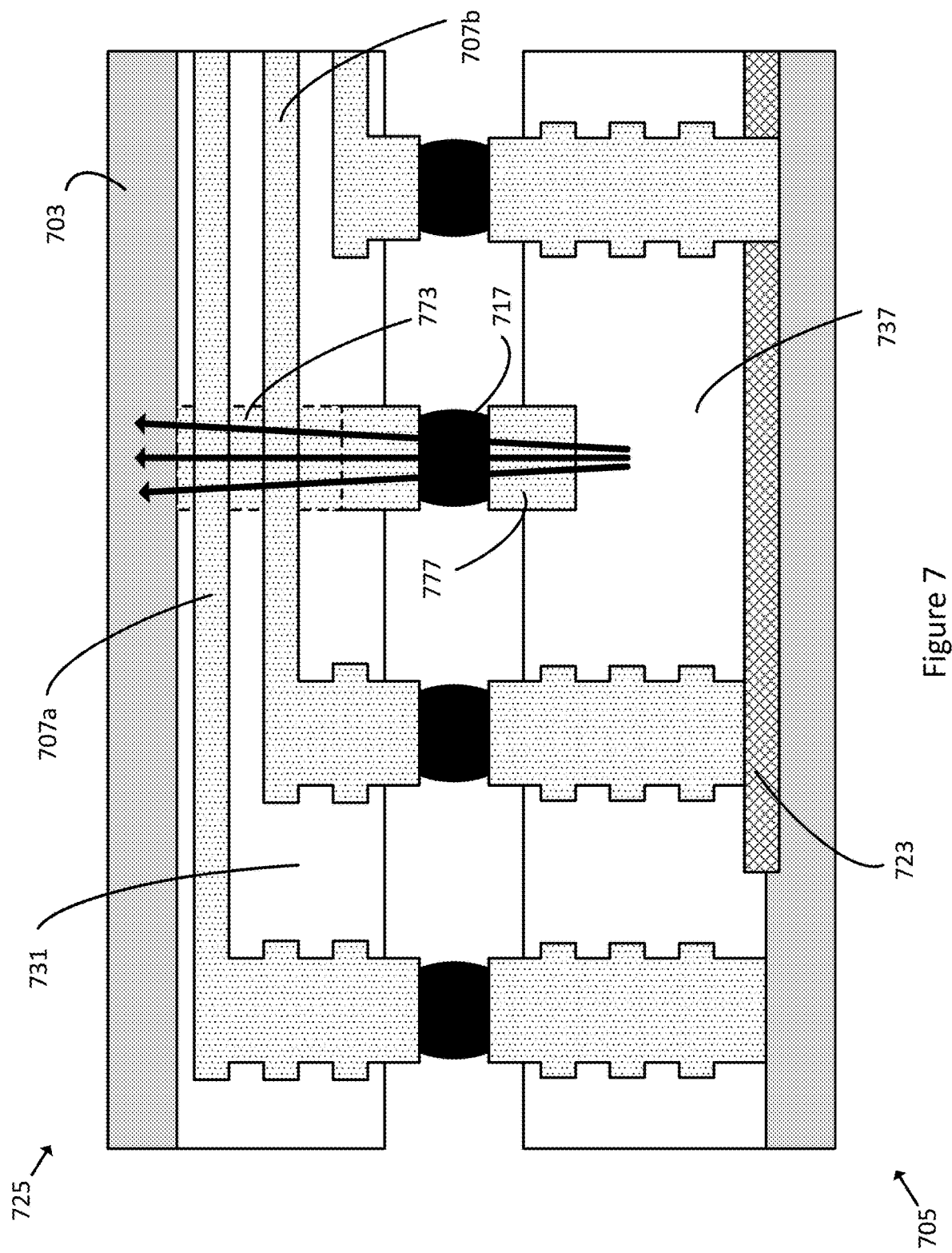
FIG. 7 depicts an alternative simplified example cross-sectional view of a bridge coupled with a die, in accordance with various embodiments.

Additionally, as noted, in some embodiments the bridge may provide a thermal solution for the die. FIG. 7 depicts an alternative simplified example cross-sectional view of a bridge 725 coupled with a die 705, in accordance with various embodiments. FIG. 7 may depict an example of how the bridge 725 may provide a thermal solution for the die 705. The bridge 725 and the die 705 may be respectively similar to, and share one or more characteristics with, bridge 325 and die 305. The bridge 725 may include a number of traces 707a and 707b (collectively, "traces 707"), and an interconnect stack 731, which may be respectively similar to, and share one or more characteristics with, traces 307a and 307b, and interconnect stack 331.

The bridge 725 may include a thermal via 773. The thermal via 773 may be formed of a thermally conductive material such as copper or some other thermally conductive material, and may be coupled with a backside 703 of the bridge 725. The backside 703 may be similar to, and share one or more characteristics with, backside 303. The thermal via 773 may at least partially overlap with the traces 707 (as indicated by the dashed portion of the thermal via 773), and so the traces 707 may be routed within the interconnect stack 731 such that they do not directly intersect the via 773. Additionally or alternatively, the thermal via 773 may not be a single via but rather may include a plurality of vias, pads, traces, etc. which may provide thermal routing through the interconnect stack 731 without directly intersecting the traces 707. In some embodiments, as shown, the thermal via 773 may couple with the backside 703 of the bridge 725, which may be similar to, and share one or more characteristics with, backside 303. In other embodiments (not shown), the thermal via 773 may not extend all the way through the interconnect stack 731. In other embodiments (not shown), the thermal via 773 may extend into the backside 703, may be flush with the surface of the backside 703, or may at least partially protrude from the backside 703.

The thermal via 773 may be coupled with a thermal via 777 of the die 305 by an interconnect such as interconnect 717. In some embodiments, the interconnect 717 may be similar to, and share one or more characteristics with, interconnect 317. In other embodiments, the interconnect 717 may be a thermal interconnect that is formed of a thermally conductive material such as one or more of the materials described above with respect to thermal via 773. Similarly to other interconnects described herein, in various embodiments the interconnect 717 may be an element of a BGA, an element of a PGA, an element of an LGA, a pillar, or some other type of interconnect.

The die 305 may also include a thermal via 777. In some embodiments, the thermal via 777 may be coupled with the back-end 737 of the die 705 (which may be similar to, and share one or more characteristics with, back-end 337). Such an embodiment is depicted in FIG. 7. In other embodiments, the thermal via 777 may be coupled with the front-end 723 of the die 705, which may be similar to, and share one or more characteristics with, front-end 323.

The thermal via 777, the interconnect 717, and the thermal via 773 may work together to facilitate the transfer of thermal energy (i.e., heat) from the die 705, through the bridge 725, and outside of the bridge 725. Such thermal energy is represented by the thick arrows pointing from the die 705 through the bridge 725. As noted with respect to FIG. 1, in some embodiments the bridge 725 may be coupled with an IHS such as IHS 160. As such, the bridge 725 may facilitate the transfer of the thermal energy from the die 705 to the IHS. In doing so, the bridge 725 may assist with spreading the heat prior to the IHS, thereby further improving thermal performance of the RF multi-chip module of which the bridge 725 is a part.

It will be understood that the above Figures are intended to show different concepts which may be used in an RF multi-chip module such as RF multi-chip modules 100 or 200. Some embodiments may include combinations of the above concepts, for example the RF shielding element depicted in FIG. 6 and the thermal solution depicted in FIG. 7. Some embodiments may include more or fewer elements than depicted (for example more or fewer interconnects, layers, traces, vias, pads, conductive pathways, etc.). Some elements of the various Figures may be larger or smaller than depicted, or have a different shape than depicted. For example, the shape or size of interconnects 415 or 417 may be different (e.g., one or both may be larger or smaller than depicted, have a different cross-sectional shape such as square, irregular, triangular, etc.). The width of the shielding element 418 may be different than depicted. The respective sizes of various vias, traces, pads, etc. may be larger or smaller than depicted. Other variations may be present in other embodiments.

Figure 8:
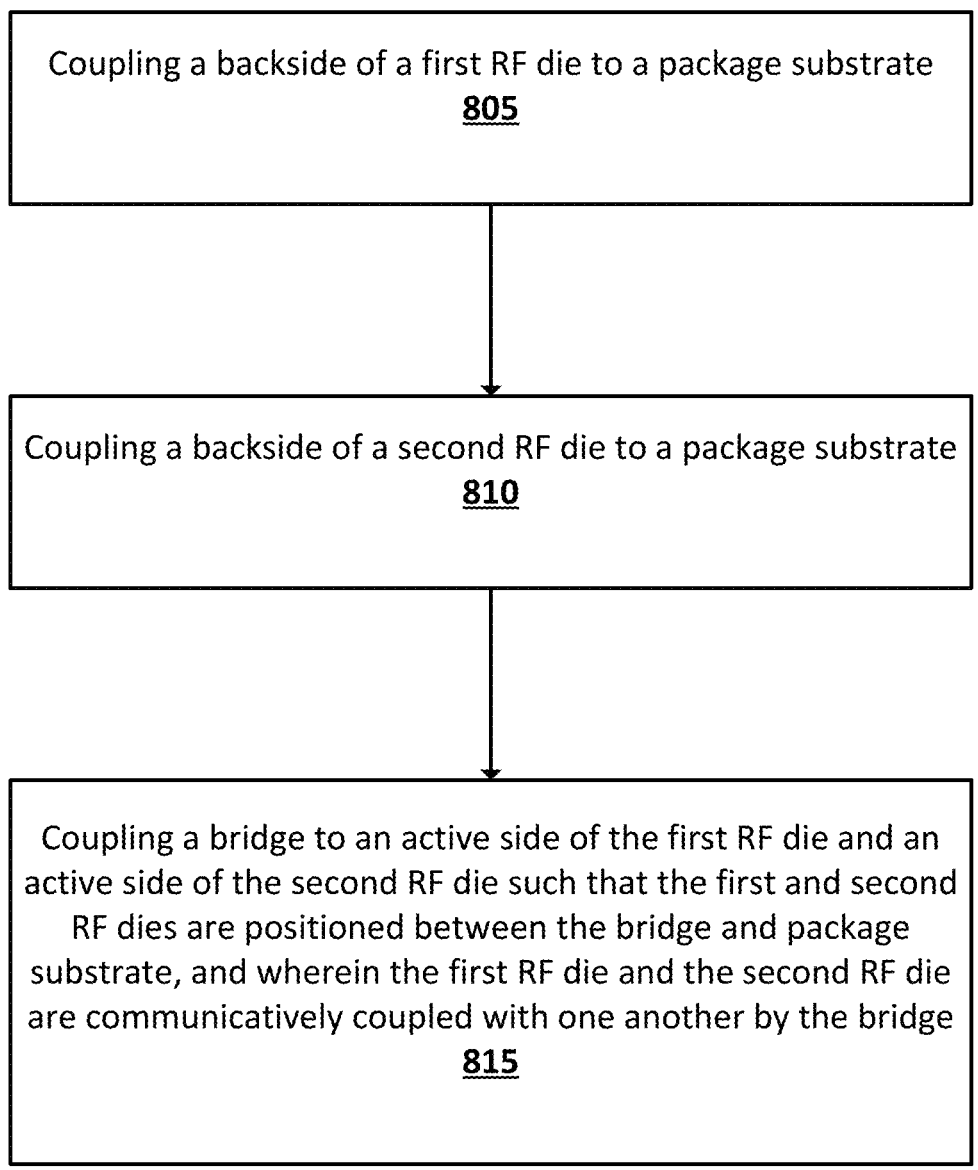
FIG. 8 depicts an example technique for the manufacture of a RF multi-chip module with a bridge, in accordance with various embodiments.

FIG. 8 depicts an example technique for the manufacture of a RF multi-chip module with a bridge, in accordance with various embodiments. Although the technique may be described with respect to FIG. 1, it will be understood that the technique may be applicable, in whole or in part, with or without modification, to other embodiments of the present disclosure.

The technique may include coupling, at 805, a backside of a first RF die to a package substrate. The RF die may be similar to, for example, one of dies 105 of FIG. 1. The package substrate may be similar to, for example, package substrate 110. The die may be coupled to the package substrate through a technique such as pick-and-place or some other type of technique.

The technique may further include coupling, at 810, a backside of a second RF die to a package substrate. The second RF die may also be similar to, for example, another die 105 of FIG. 1. Similarly, the second RF die may be coupled to the package substrate through a technique such as pick-and-place or some other technique.

The technique may further include coupling, at 815, a bridge to an active side (e.g., a front-side) of the first RF die and an active side of the second RF die. The bridge may be similar to, for example, bridge 125 of FIG. 1. The bridge may be coupled to the first and second RF dies such that the dies are positioned between the bridge and the package substrate. Also, the first RF die and the second RF die may be communicatively coupled with one another by the bridge, for example through traces such as traces 307 or some other traces.

It will be understood that the above-described technique is intended as one example technique, and other embodiments may include one or more variations from the technique described above. For example, certain elements such as elements 805 and 810 may be performed simultaneously with one another, or in a different order than depicted. In some embodiments, the dies may be coupled with the bridge, and then the bridge/die structure may be coupled with the package substrate. Other variations may be present in other embodiments.

Figure 9:
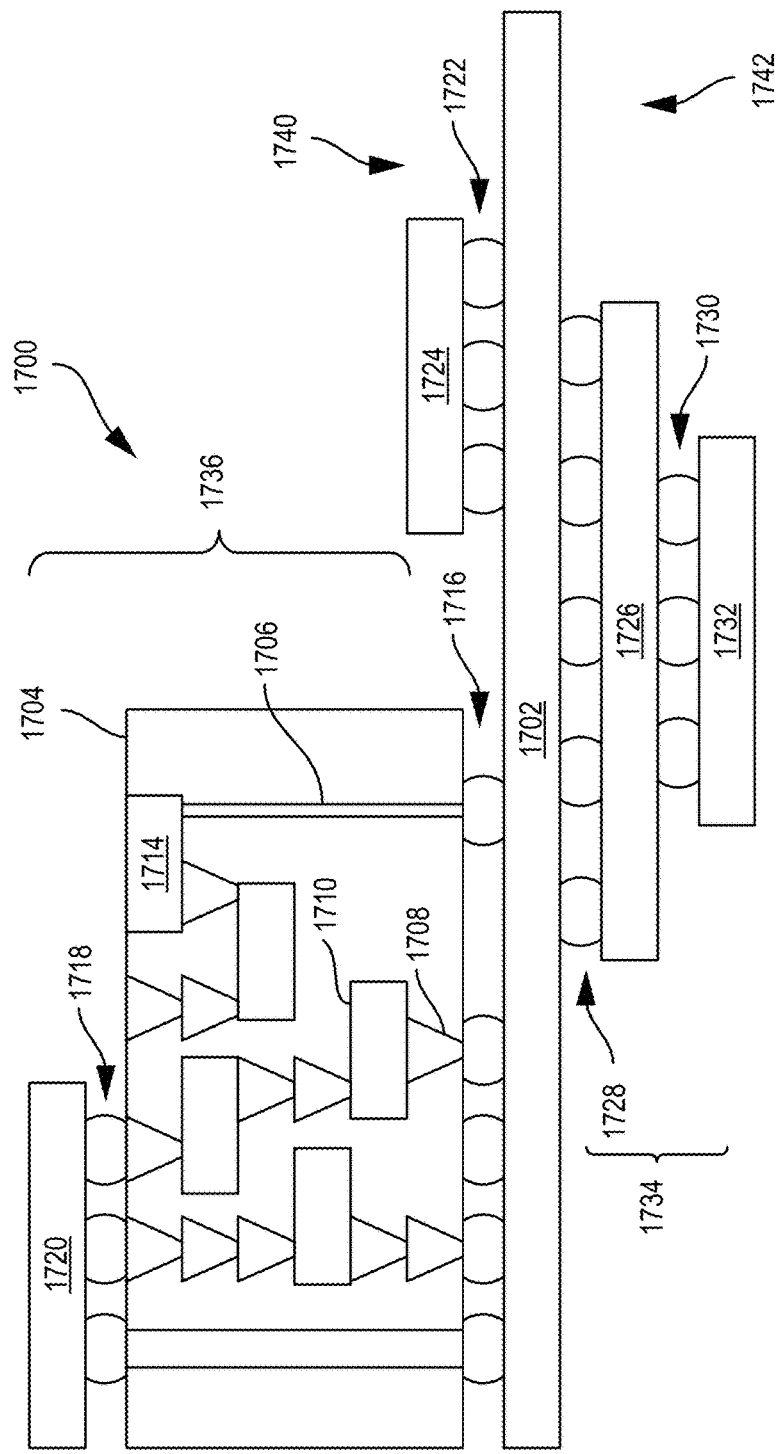
FIG. 9 is a side, cross-sectional view of an integrated circuit (IC) device assembly that may include a RF multi-chip module with a bridge, in accordance with various embodiments.

FIG. 9 is a side, cross-sectional view of an IC device assembly 1700 that may include one or more IC packages or other electronic components (e.g., a die) including one or more bridges, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die, an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
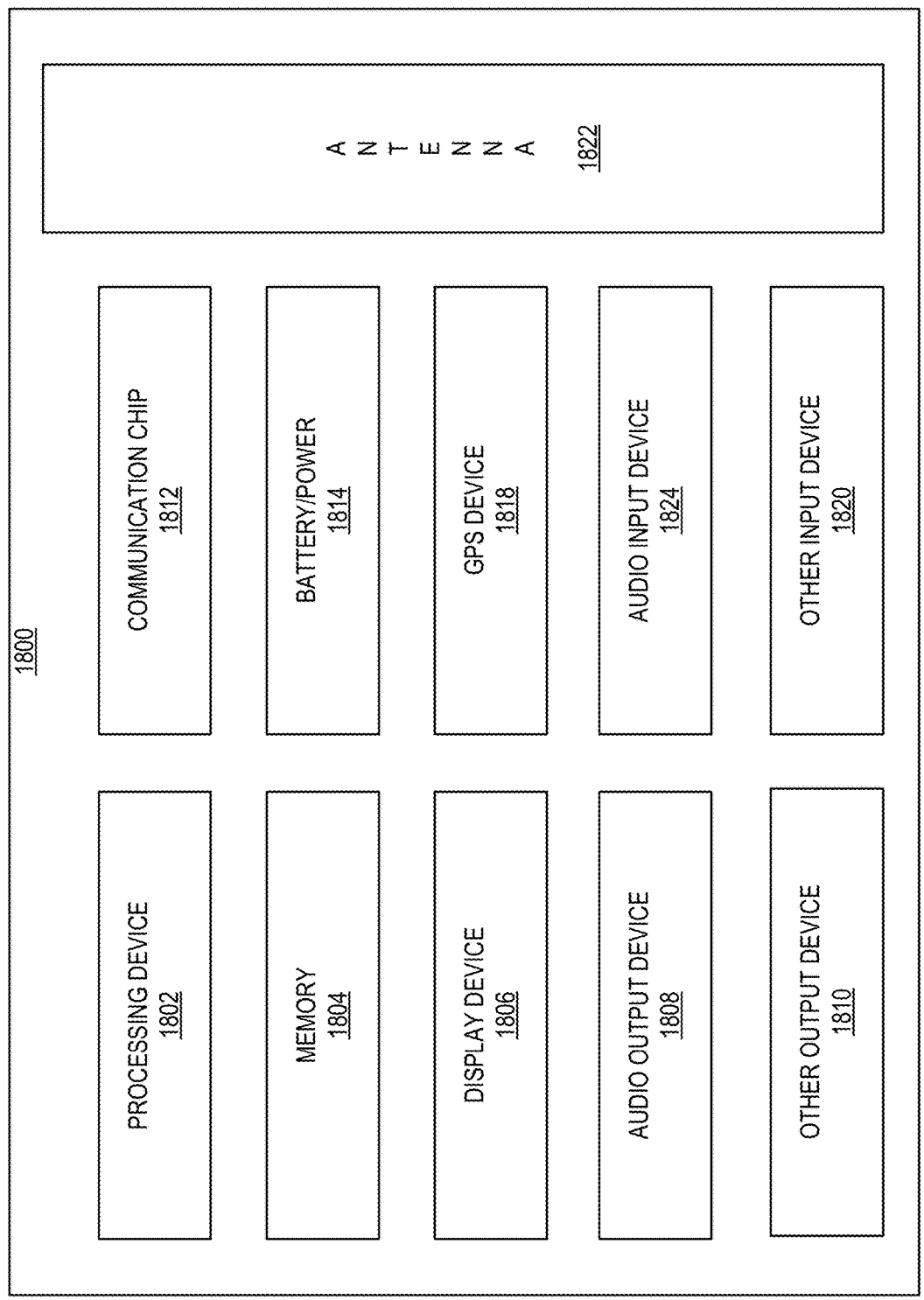
FIG. 10 is a block diagram of an example electrical device that may include a RF multi-chip module with a bridge, in accordance with various embodiments.

FIG. 10 is a block diagram of an example electrical device 1800 that may include one or more RF multi-chip modules with a silicon bridge, in accordance with any of the embodiments disclosed herein. For example, any suitable ones of the components of the electrical device 1800 may include one or more of the IC device assemblies 1700, IC packages 1650, IC devices 1600, or RF dies disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a RF multi-chip module comprising: a package substrate; a first RF die coupled with the package substrate at an inactive side of the first RF die; a second RF die coupled with the package substrate at an inactive side of the second RF die; and a bridge coupled with an active side of the first RF die and an active side of the second RF die such that the first and second RF dies are communicatively coupled through the bridge, and such that the first and second RF dies are at least partially between the package substrate and the bridge.

Example 2 includes the RF multi-chip module of example 1, wherein the bridge includes silicon.

Example 3 includes the RF multi-chip module of example 1, wherein the bridge includes a thermal via that is thermally coupled with the first RF die, and wherein the thermal via is to facilitate transfer of thermal energy from the first RF die to a side of the bridge that is opposite a side of the bridge that is adjacent to the first RF die.

Example 4 includes the RF multi-chip module of example 3, further comprising an IHS coupled with the bridge such that the bridge is located between the IHS and the package substrate, and wherein the thermal via is to facilitate the transfer of the thermal energy from the first RF die to the IHS.

Example 5 includes the RF multi-chip module of any of examples 1-4, further comprising an electromagnetic shield element that is at least partially positioned between, and coupled with, the bridge and the package substrate, and wherein the electromagnetic shield element surrounds a signal interconnect between the first RF die and the bridge, and wherein the electromagnetic shield element is to provide electromagnetic shielding of the signal interconnect.

Example 6 includes the RF multi-chip module of example 5, wherein the electromagnetic shield element includes an interconnect coupled with the package substrate and the bridge.

Example 7 includes the RF multi-chip module of example 6, wherein the electromagnetic shield element is communicatively coupled with a die backside metallization layer of the first RF die.

Example 8 includes the RF multi-chip module of example 6, wherein the electromagnetic shield element includes a portion of the bridge.

Example 9 includes the RF multi-chip module of example 8, wherein the portion of the bridge is a ground layer of the bridge that is furthest from the first RF die.

Example 10 includes a RF SiP that includes: a package substrate; a RF die coupled with the package substrate at an inactive side of the RF die; and a bridge coupled with an active side of the RF die that is opposite the inactive side of the RF die, wherein the bridge includes a signal layer, a ground layer, and a power layer.

Example 11 includes the RF SiP of example 10, wherein the signal layer is communicatively coupled with the RF die, and wherein the signal layer is to facilitate transmission of an electronic signal between the RF die and another element of an electronic device that includes the RF SiP.

Example 12 includes the RF SiP of examples 10 or 11, wherein the signal layer is communicatively coupled with the RF die, and wherein the signal layer is to facilitate transmission of an electronic signal between the RF die and another RF die that is coupled with the package substrate.

Example 13 includes the RF SiP of examples 10 or 11, wherein the ground layer is communicatively coupled with a ground layer of the package substrate by an interconnect.

Example 14 includes the RF SiP of examples 10 or 11, wherein the power layer is communicatively coupled with a power layer of the package substrate by an interconnect.

Example 15 includes a method of forming a microelectronic package, wherein the method comprises: coupling a backside of a first RF die to a package substrate; coupling a backside of a second RF die to the package substrate; and coupling a bridge to an active side of the first RF die and an active side of the second RF die such that the first and second RF dies are positioned between the bridge and package substrate, and wherein the first RF die and the second RF die are communicatively coupled with one another by the bridge.

Example 16 includes the method of example 15, further comprising coupling an IHS to the bridge such that the bridge is at least partially between the first RF die and the IHS.

Example 17 includes the method of example 15, wherein coupling the bridge to the active side of the first RF die and the active side of the second RF die includes coupling the bridge to the package substrate.

Example 18 includes the method of any of examples 15-17, wherein coupling the bridge to the active side of the first RF die and the active side of the second RF die includes positioning a signal interconnect between the die and the bridge inside of an electromagnetic shielding element that is at least partially positioned between the package substrate and the bridge.

Example 19 includes the method of example 18, wherein the electromagnetic shielding element includes a backside metallization layer of the first RF die.

Example 20 includes the method of example 18, wherein the electromagnetic shielding element includes a ground layer of the bridge.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A radio frequency (RF) multi-chip module comprising:
   a package substrate;
   a first RF die coupled with the package substrate at an inactive side of the first RF die;
   a second RF die coupled with the package substrate at an inactive side of the second RF die; and
   a bridge coupled with an active side of the first RF die and an active side of the second RF die such that the first and second RF dies are communicatively coupled through the bridge, and such that the first and second RF dies are at least partially between the package substrate and the bridge, wherein the bridge includes a thermal via that is thermally coupled with the first RF die, and wherein the thermal via is to facilitate transfer of thermal energy from the first RF die to a side of the bridge that is opposite a side of the bridge that is adjacent to the first RF die.

2. The RF multi-chip module of claim 1, further comprising an integrated heat spreader (IHS) coupled with the bridge such that the bridge is located between the IHS and the package substrate, and wherein the thermal via is to facilitate the transfer of the thermal energy from the first RF die to the IHS.

3. A radio frequency (RF) multi-chip module comprising:
   a package substrate;
   a first RF die coupled with the package substrate at an inactive side of the first RF die;
   a second RF die coupled with the package substrate at an inactive side of the second RF die;
   a bridge coupled with an active side of the first RF die and an active side of the second RF die such that the first and second RF dies are communicatively coupled through the bridge, and such that the first and second RF dies are at least partially between the package substrate and the bridge; and
   an electromagnetic shield element that is at least partially positioned between, and coupled with, the bridge and the package substrate, and wherein the electromagnetic shield element surrounds a signal interconnect between the first RF die and the bridge, and wherein the electromagnetic shield element is to provide electromagnetic shielding of the signal interconnect.

4. The RF multi-chip module of claim 3, wherein the electromagnetic shield element includes an interconnect coupled with the package substrate and the bridge.

5. The RF multi-chip module of claim 4, wherein the electromagnetic shield element is communicatively coupled with a die backside metallization layer of the first RF die.

6. The RF multi-chip module of claim 4, wherein the electromagnetic shield element includes a portion of the bridge.

7. The RF multi-chip module of claim 6, wherein the portion of the bridge is a ground layer of the bridge that is furthest from the first RF die.

8. A radio frequency (RF) system-in-package (SiP) that includes:
   a package substrate;
   a RF die coupled with the package substrate at an inactive side of the RF die; and
   a bridge coupled with an active side of the RF die that is opposite the inactive side of the RF die, wherein the bridge includes a signal layer, a ground layer, and a power layer.

9. The RF SiP of claim 8, wherein the signal layer is communicatively coupled with the RF die, and wherein the signal layer is to facilitate transmission of an electronic signal between the RF die and another element of an electronic device that includes the RF SiP.

10. The RF SiP of claim 8, wherein the signal layer is communicatively coupled with the RF die, and wherein the signal layer is to facilitate transmission of an electronic signal between the RF die and another RF die that is coupled with the package substrate.

11. The RF SiP of claim 8, wherein the ground layer is communicatively coupled with a ground layer of the package substrate by an interconnect.

12. The RF SiP of claim 8, wherein the power layer is communicatively coupled with a power layer of the package substrate by an interconnect.

13. A method of forming a microelectronic package, wherein the method comprises:
   coupling a backside of a first radio frequency (RF) die to a package substrate;
   coupling a backside of a second RF die to the package substrate;
   coupling a bridge to an active side of the first RF die and an active side of the second RF die such that the first and second RF dies are positioned between the bridge and package substrate, and wherein the first RF die and the second RF die are communicatively coupled with one another by the bridge; and
   coupling an integrated heat spreader (IHS) to the bridge such that the bridge is at least partially between the first RF die and the IHS.

14. A method of forming a microelectronic package, wherein the method comprises:
   coupling a backside of a first radio frequency (RF) die to a package substrate;
   coupling a backside of a second RF die to the package substrate; and coupling a bridge to an active side of the first RF die and an active side of the second RF die such that the first and second RF dies are positioned between the bridge and package substrate, and wherein the first RF die and the second RF die are communicatively coupled with one another by the bridge, wherein coupling the bridge to the active side of the first RF die and the active side of the second RF die includes positioning a signal interconnect between the die and the bridge inside of an electromagnetic shielding element that is at least partially positioned between the package substrate and the bridge.

15. The method of claim 14, wherein the electromagnetic shielding element includes a backside metallization layer of the first RF die.

16. The method of claim 14, wherein the electromagnetic shielding element includes a ground layer of the bridge.

* * * * *

UNITED STATES PATENT AND TRADEMARK OFFICE
CERTIFICATE OF CORRECTION

| | | |
|---|---|---|
| PATENT NO. | : 11,688,660 B2 | |
| APPLICATION NO. | : 16/534820 | |
| DATED | : June 27, 2023 | |
| INVENTOR(S) | : Aleksandar Aleksov et al. | |

It is certified that error appears in the above-identified patent and that said Letters Patent is hereby corrected as shown below:

On the Title Page

In Item (57), under "ABSTRACT", in Column 2, Line 6, delete "dies die" and insert -- dies --, therefor.

Signed and Sealed this
Eighth Day of August, 2023

Katherine Kelly Vidal
*Director of the United States Patent and Trademark Office*